US008815126B2

(12) United States Patent
Winoto

(10) Patent No.: US 8,815,126 B2
(45) Date of Patent: Aug. 26, 2014

(54) METHOD AND COMPOSITION FOR SCREEN PRINTING OF CONDUCTIVE FEATURES

(75) Inventor: Adrian Winoto, San Francisco, CA (US)

(73) Assignee: Cambrios Technologies Corporation, Sunnyvale, CA (US)

(*) Notice: Subject to any disclaimer, the term of this patent is extended or adjusted under 35 U.S.C. 154(b) by 316 days.

(21) Appl. No.: 12/380,294

(22) Filed: Feb. 25, 2009

(65) Prior Publication Data

US 2009/0223703 A1 Sep. 10, 2009

Related U.S. Application Data

(60) Provisional application No. 61/031,528, filed on Feb. 26, 2008.

(51) Int. Cl.
*H01B 1/22* (2006.01)
*C09D 11/00* (2014.01)
*H05K 3/00* (2006.01)
*B82Y 10/00* (2011.01)
*H05K 1/09* (2006.01)

(52) U.S. Cl.
CPC ........ *C09D 11/322* (2013.01); *H05K 2201/026* (2013.01); *C09D 11/30* (2013.01); *H05K 3/00* (2013.01); *B82Y 10/00* (2013.01); *H05K 1/097* (2013.01); *C09D 11/52* (2013.01); *Y10S 977/762* (2013.01)
USPC ......... 252/514; 252/512; 106/1.18; 106/1.19; 106/1.26; 106/194.1; 106/194.2; 977/762

(58) Field of Classification Search
CPC ........ C09D 11/52; C09D 101/02; H01B 1/22; C08K 7/02; C08K 7/06
USPC .................. 252/500, 502, 512, 514; 428/206; 106/1.18, 1.19, 1.26, 194.1, 194.2; 977/762
See application file for complete search history.

(56) References Cited

U.S. PATENT DOCUMENTS

| 5,612,408 | A   | * | 3/1997  | Konig et al. ............... 524/591 |
| 6,975,067 | B2  |   | 12/2005 | McCormick et al.                    |
| 7,018,872 | B2  |   | 3/2006  | Hirai et al.                        |
| 7,052,940 | B2  |   | 5/2006  | Lee                                 |
| 7,062,848 | B2  | * | 6/2006  | Pan et al. ........................ 29/825 |
| 7,097,788 | B2  | * | 8/2006  | Kirkor et al. ................. 252/502 |
| 7,630,041 | B2  |   | 12/2009 | Liu et al.                          |
| 7,780,876 | B2  |   | 8/2010  | Nakatani                            |
| 8,018,563 | B2  |   | 9/2011  | Jones et al.                        |
| 8,094,247 | B2  |   | 1/2012  | Allemand et al.                     |
| 2004/0038808 | A1 |   | 2/2004 | Hampden-Smith et al. .. 502/180    |
| 2005/0074589 | A1 |   | 4/2005 | Pan et al.                          |
| 2005/0089679 | A1 |   | 4/2005 | Ittel et al. ..................... 428/323 |
| 2005/0173680 | A1 |   | 8/2005 | Yang ............................. 252/500 |
| 2005/0197419 | A1 |   | 9/2005 | Graziano et al.                     |
| 2005/0204956 | A1 |   | 9/2005 | Berkei et al.                       |
| 2005/0215689 | A1 |   | 9/2005 | Garbar et al.                       |
| 2006/0189113 | A1 |   | 8/2006 | Vanheusden et al.                   |
| 2006/0199877 | A1 |   | 9/2006 | Ganapathiappan                      |
| 2007/0074316 | A1 |   | 3/2007 | Alden et al.                        |
| 2008/0003363 | A1 |   | 1/2008 | Park et al.                         |
| 2008/0143906 | A1 |   | 6/2008 | Allemand et al.                     |
| 2008/0210052 | A1 |   | 9/2008 | Allemand                            |
| 2009/0052029 | A1 |   | 2/2009 | Dai et al.                          |
| 2009/0228131 | A1 |   | 9/2009 | Wolk et al.                         |

FOREIGN PATENT DOCUMENTS

| EP | 0 765 704 A2   | 4/1997  |
| EP | 1 138 729 A1   | 10/2001 |
| EP | 1 550 632 A1   | 7/2005  |
| EP | 1 769 867 A1   | 4/2007  |
| JP | 2003-43238 A   | 2/2003  |
| JP | 2003-515622 A  | 5/2003  |
| JP | 2004-34228 A   | 2/2004  |
| JP | 2004-127676 A  | 4/2004  |
| JP | 2004-196912 A  | 7/2004  |
| JP | 2004-196923 A  | 7/2004  |
| JP | 2004-223693 A  | 8/2004  |
| JP | 2005-126664 A  | 5/2005  |
| JP | 2005-290362 A  | 10/2005 |
| JP | 2005-530005 A  | 10/2005 |
| JP | 2006-118036 A  | 5/2006  |
| JP | 2006-219625 A  | 8/2006  |
| JP | 2006-519291 A  | 8/2006  |
| JP | 2006-233252 A  | 9/2006  |
| JP | 2006-257418 A  | 9/2006  |
| JP | 2006-294550 A  | 10/2006 |
| JP | 2006-307046 A  | 11/2006 |
| JP | 2007-194174 A  | 8/2007  |
| JP | 2007-230021 A  | 9/2007  |
| JP | 2007-291239 A  | 11/2007 |
| JP | 2008-3606 A    | 1/2008  |
| JP | 2008-198595 A  | 8/2008  |

(Continued)

OTHER PUBLICATIONS

Sun et al., "Crystalline Silver Nanowires by Soft Solution Processing," Nano Letters 2(2): 165-168, 2002.

(Continued)

*Primary Examiner* — Mark Kopec
*Assistant Examiner* — Haidung Nguyen
(74) *Attorney, Agent, or Firm* — Seed IP Law Group PLLC

(57) ABSTRACT

Disclosed is a method of screen printing an electrically conductive feature on a substrate, the electrically conductive feature including metallic anisotropic nanostructures, and a coating solution therefore.

12 Claims, 7 Drawing Sheets

(56) References Cited

FOREIGN PATENT DOCUMENTS

| | | |
|---|---|---|
| JP | 2008-258147 A | 10/2008 |
| JP | 2010-507199 A | 3/2010 |
| JP | 2010-525526 A | 7/2010 |
| JP | 4800609 B2 | 10/2011 |
| WO | 01/39135 A2 | 5/2001 |
| WO | 03/106573 A1 | 12/2003 |
| WO | WO 2004/005413 A1 | 1/2004 |
| WO | 2004/069941 A2 | 8/2004 |
| WO | 2005/099941 A1 | 10/2005 |
| WO | 2006/066033 A1 | 6/2006 |
| WO | 2006/076616 A2 | 7/2006 |
| WO | 2007/022226 A2 | 2/2007 |
| WO | WO2007022226 * | 2/2007 |
| WO | 2008/046058 A2 | 4/2008 |
| WO | 2008/131304 A1 | 10/2008 |
| WO | 2009/018261 A2 | 2/2009 |

OTHER PUBLICATIONS

Toyobo Vylon Dept., 2005, retrieved May 22, 2013, from http://www.toyobo.co.jp/seihin/xi/vylonal/index.htm, 6 pages.

* cited by examiner

METHOD AND COMPOSITION FOR SCREEN PRINTING OF CONDUCTIVE FEATURES

CROSS-REFERENCE TO RELATED APPLICATIONS

This application claims the benefit under 35 U.S.C. §119 (e) of U.S. Provisional Patent Application No. 61/031,528 filed Feb. 26, 2008, which application is incorporated herein by reference in its entirety.

BACKGROUND

1. Technical Field

This disclosure is related to formation of conductive features on substrates.

2. Related Art

Transparent conductors refer to thin conductive films coated on high-transmittance surfaces or substrates. Transparent conductors may be manufactured to have surface conductivity while maintaining reasonable optical transparency. Such surface conducting transparent conductors are widely used as transparent electrodes in flat liquid crystal displays, touch panels, electroluminescent devices, and thin film photovoltaic cells, as anti-static layers and as electromagnetic wave shielding layers.

Currently, vacuum deposited metal oxides, such as indium tin oxide (ITO), are the industry standard materials to provide optically transparency and electrical conductivity to dielectric surfaces such as glass and polymeric films. However, metal oxide films are fragile and prone to damage during bending or other physical stresses. They also require elevated deposition temperatures and/or high annealing temperatures to achieve high conductivity levels. There also may be issues with the adhesion of metal oxide films to substrates that are prone to adsorbing moisture such as plastic and organic substrates, e.g. polycarbonates. Applications of metal oxide films on flexible substrates are therefore severely limited. In addition, vacuum deposition is a costly process and requires specialized equipment. Moreover, the process of vacuum deposition is not conducive to forming patterns and circuits. This typically results in the need for expensive patterning processes such as photolithography.

Conductive polymers have also been used as optically transparent electrical conductors. However, they generally have lower conductivity values and higher optical absorption (particularly at visible wavelengths) compared to the metal oxide films, and suffer from lack of chemical and long-term stability.

Recently, transparent conductors formed using conductive nanostructures have been developed and provide some advantages over the types of transparent conductors mentioned above. In particular, transparent conductors formed using conductive nanostructures are relatively flexible, can be fabricated using wet coating processes and can exhibit desirable electrical and optical characteristics. Such transparent conductors and disclosed, for example, in U.S. patent application Ser. Nos. 11/766,552; 11/504,822; 11/871,767; and 11/871,721 which are incorporated by reference herein in its entirety. Additionally, while a number of the device applications mentioned above can use transparent conductive sheets having a relatively large, contiguous conductive area, many of these applications also require layers in which only small areas, patterns, traces, lines or other such features are conductive. While methods have been developed to pattern nanostructure based transparent conductors, such patterning processes may present manufacturing inefficiencies. Accordingly, there is a need to be able to produce nanostructure based conductive films having conductive patterns or features.

SUMMARY OF THE INVENTION

In accordance with the present invention, an electrically conductive feature is formed on a substrate wherein the electrically conductive feature includes metallic anisotropic nanostructures and the electrically conductive feature is formed by screen printing onto the substrate a coating solution containing the metallic anisotropic nanostructures. A coating solution for screen printing an electrically conductive feature in accordance with the present invention preferably includes a thickener and metallic anisotropic nanostructures. The coating solution can additionally include a solvent and a base.

DETAILED DESCRIPTION

Figure 1:
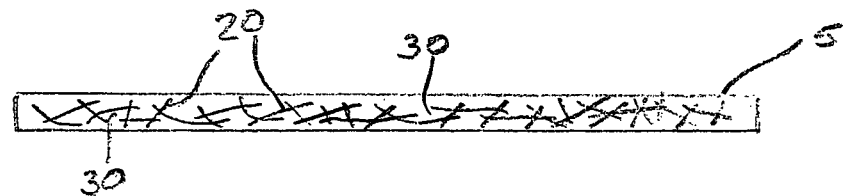
FIG. 1 is a drawing of a conductive feature including anisotropic nanostructures above a percolation threshold in accordance with the present invention.

In accordance with the present invention, transparent conductive layers and features can be formed on a substrate by screen printing of coating solutions including conductive nanostructures. Screen printing is a method of applying a coating solution to a substrate that uses a mesh or screen to support a stencil that generally includes one or more features that block the ink from passing through the screen to the substrate. Ink is forced through the screen by a roller, squeegee or other such device that is moved across the screen's surface.

For the screen printing process to produce sharp-edged features on the substrate that accurately match the features of the stencil, the coating solution must have a relatively high viscosity. In particular, it is preferable if the coating solution has a viscosity of greater than 200 cP, and more preferably greater than about 900 cP. However, as discussed below, for the features formed on the substrate to be conductive, the conductive nanostructures therein must be adequately dispersed to be able to form a conductive network. Such adequate dispersion can be difficult to achieve in a coating solution of a high enough viscosity to effectively screen print. In accordance with the present invention, a coating solution having metallic anisotropic nanostructures is used to screen print transparent, electrically conductive features onto a substrate.

Conductive Nanostructures

Coating solutions in accordance with the present invention preferably include electrically conductive nanostructures. As used herein, "nanostructures" generally refer to nano-sized structures, at least one dimension of which is less than 500 nm, more preferably, less than 250 nm, 100 nm or 25 nm. Preferably, the nanostructures used in a coating solution in accordance with the present invention are anisotropically shaped, that is, they have an aspect ratio (ratio of length to diameter) that is not equal to one. Use of isotropic nanostructures in producing transparent conductive features can be difficult because relatively high weight percents (or surface loading levels) of such nanostructures may be necessary to achieve desired levels of conductivity. Such high loading levels can unacceptably impact optical characteristics such as haze (e.g. cause generally higher haze) and transparency (e.g. cause generally lower transparency). However, use of anisotropic nanostructures in screen printing applications can be challenging because the length of the nanostructures can make dispersion of the nanostructures in a suitably viscous coating solution difficult. Coating solutions and methods and of screen printing in accordance with the present invention advantageously overcome these difficulties.

The nanostructures can be solid or hollow. Solid anisotropic nanostructures include, for example, nanowires. Hollow anisotropic nanostructures include, for example, nanotubes. Typically, anisotropic nanostructures have a diameter from 5 to 500 nm, more preferably from 10 to 100 nm, and more preferably from 30 to 90 nm with length from 100 nm to 10 um. and more preferably from 500 nm to 1 um.

The nanostructures can be formed of any conductive material. Most typically, the conductive material is metallic. Semiconductive or non-conductive nanostructures generally don't perform well with the methods and apparatus disclosed herein to produce transparent, conductive features on a substrate because relatively high percentages of such materials may need to be used to achieve acceptable conductivity. And, such relatively high amounts may negatively affect the optical properties of a produced feature. The metallic material can preferably be a pure metal, metal alloy or a bimetallic material, which comprises two or more types of metal. Suitable metals include, but are not limited to, silver, gold, copper, nickel, gold-plated silver, platinum and palladium. It is also considered that small amount of oxide caused by atmospheric oxidation of metals may also be present.

Conductive anisotropic nanostructures can preferably be used as the primary conductive medium in a coating solution in accordance with the present invention. A preferred type of anisotropic metallic nanostructures includes metal nanowires. Metal nanowires are nanowires formed of metal, metal alloys, or plated metals. Suitable metal nanowires include, but are not limited to, silver nanowires, gold nanowires, copper nanowires, nickel nanowires, gold-plated silver nanowires, platinum nanowires, and palladium nanowires. Co-pending and co-owned U.S. application Ser. Nos. 11/766,552, 11/504,822, 11/871,767, and 11/871,721 describe methods of preparing metal nanowires (e.g., silver nanowires), the descriptions of which are incorporated herein by reference in their entireties.

Another preferred type of anisotropic metallic nanostructures used in the primary conductive medium includes metal nanotubes. Co-pending and co-owned U.S. patent application Ser. No. 12/106,244, filed Apr. 18, 2008, describes methods of preparing metal nanotubes (e.g., gold nanotubes) the description of which is incorporated herein by reference in their entireties.

In various embodiments, the conductive nanowires are about 5-100 μm long and 5-100 nm in diameter (or cross-section). In certain embodiments, the nanowires are about 5-30 μm long and 20-80 nm in diameter. In a preferred embodiment, the nanowires (e.g., silver nanowires) are about 20 μm long and 50 nm in diameter. Suitable nanotubes have similar dimensions as those described for nanowires. For nanotubes, the diameter refers to the outer diameter of the nanotubes.

Conductive Features

In a conductive feature formed on a substrate, anisotropic nanostructures form a conductive network through a percolation process. Percolative conductivity can be established when a conductive path is formed through interconnecting anisotropic nanostructures. Sufficient nanostructures must be present to reach an electrical percolation threshold and become conductive. The electrical percolation threshold is therefore a value related to the loading density or concentration of the nanostructures, above which long range connectivity can be achieved. Typically, the loading density refers to the number of nanostructures per area, which can be represented by "number/$\mu m^2$".

As described in co-pending U.S. patent application Ser. No. 11/504,822, the higher the aspect ratio of the anisotropic nanostructures, the fewer nanostructures are needed to achieve percolative conductivity. For anisotropic nanostructures, such as nanowires or nanotubes, the electrical percolation threshold or the loading density is inversely related to the $length^2$ (length squared) of the nanowires or nanotubes. Co-pending and co-owned application Ser. No. 11/871,053, which is incorporated herein by reference in its entirety, describes in detail the theoretical as well as empirical relationship between the sizes/shapes of the anisotropic nanostructues and the surface loading density at the percolation threshold.

FIG. 1 shows schematically a conductive feature 5 on the surface of a substrate (not shown) wherein a conductive network is formed by conductive anisotropic nanostructures 20 at or above an electrical percolation threshold. Conductive paths are formed by interconnecting nanostructures 20 (e.g., a path can be traced from one end of the network to the other through connecting nanostructures). An electrical current can therefore be carried across the anisotropic nanostructures network.

As used herein, "conductive network" or "network" refers to an interconnecting network formed by conductive nanostructures above an electrical percolation threshold. Typically, a conductive network has surface resistivity of no higher than $10^8$ ohms/square (also referred to as "Ω/□"). Preferably, the surface resistivity is no higher than $10^4$ Ω/□, 3,000 Ω/□, 1,000 Ω/□ or 100 Ω/□. Typically, the surface resistivity of a conductive network formed by metal nanowires or nanotubes is in the ranges of from 10 Ω/□ to 1000 Ω/□, from 100 Ω/□ to 750 Ω/□, 50 Ω/□ to 200 Ω/□, from 100 Ω/□ to 500 Ω/□, or from 100 Ω/□ to 250 Ω/□, or 10 Ω/□ to 200 Ω/□, from 10 Ω/□ to 50 Ω/□, or from 1 Ω/□ to 10 Ω/□. Such resistance ranges are as taken by a two point resistance probes contacting opposite ends of a conductive feature and dividing the resultant resistance by the number of squares making up the feature. For example, a feature that is 100 um long and 1 um wide would be made up of 100 squares.

Also shown in FIG. 1, the anisotropic nanostructures define inter-wire spaces 30. At above the percolation threshold, the size of the inter-wire space (also referred to as "mesh size")

correlates to the conductivity of the network. Typically, smaller mesh size means more densely distributed nanostructures, which in turn correspond to higher conductivity.

Figure 2:
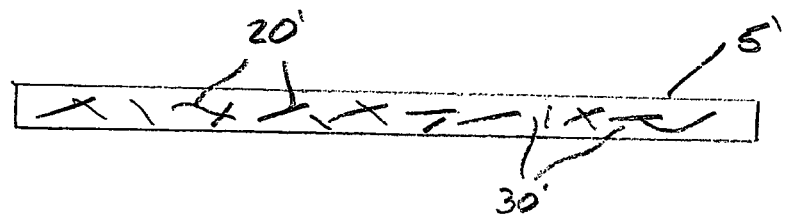
FIG. 2 is a drawing of a feature including anisotropic nanostructures below a percolation threshold.

Mesh size can also be used as an indicator of the nanostructures surface loading level. For example, for anisotropic nanostructures of a given length, lower surface loading will result in larger mesh size. When the mesh size is above certain threshold value, the nanostructures can become too far apart such that percolation is no longer possible and the inter-wire spaces effectively become insulators. FIG. 2 shows a feature 5' in which an nanostructures 20' are at an insufficient density to form a complete network. The inter-wire spaces 30' become insulating. Stately differently, due to the lower density of the nanostructures as compared to that in FIG. 1, the mesh size has enlarged and the conductivity between nanostructures is disrupted.

Coating Solutions

As discussed above, in order to generate a surface features that are electrically conducting, it is important that the anisotropic nanostructure loading level be sufficient to form a percolative network in the feature. Accordingly, the amount and dispersion of anisotropic nanostructures in a coating solution is important to be able to produce an electrically conductive surface feature. Further, the viscosity of the coating solution must be high enough to produce a clean line, accurate feature on the substrate.

A coating solution in accordance with one embodiment preferably includes a thickener and metallic, anisotropic nanostructures. In particular, coating solutions in accordance with this embodiment can include from 99.0% to 99.9% by weight thickener and from 0.1% to 1.0% by weight metallic, anisotropic nanostructures. Suitable anisotropic nanostructures are discussed above. Thickeners can, for example, include Dupont® 3571, (a proprietary polymer in dipropylene glycol monomethyl ether by DuPont Electronic Technologies, North Carolina, US), a water-based co-polyester sold under the trade name of Vylonal® (Toyobo Group, Japan) and a non-ionic polyurethane-based thickner in a 4:6 solution of water: propylene glycol sold under the trade name of Borchi® Gel PW 25 (OMG Borchers GmbH, Germany). It is also considered that these and other polyesters and polyurethanes be used as thickeners in any of the embodiments disclosed herein. Another embodiment of a coating solution in accordance with the present invention may have a ratio by weight of thickener to metallic nanostructures of from 99 to 999. In such embodiment the thickener may, for example, be Dupont® 3571, Toyobo Vylonal® and Borchi® Gel PW 25; and the metallic nanostructures may, for example, be silver nanowires and/or gold nanotubes or any other metallic anisotropic nanostructures disclosed herein.

A coating solution in accordance with another embodiment preferably includes a thickener, metallic, anisotropic nanostructures, solvent and a base. In particular, coating solutions in accordance with this embodiment can include from 0.1% to 8% by weight thickener, such as, for example, a water-based acrylic sold by Polymer Innovations® under the trade names WB40B-63 or WB40B-64; 0.01% to 0.2% by weight base such as, for example, ammonium hydroxide or any other base; from 0.5% to 1% by weight metallic anisotropic nanostructures; and from 90.8% to 99.4% by weight solvent such as, for example, water or any other solvent such as an alcohol. For either Polymer Innovations® WB40B-63 or WB40B-64, the solution thickens when neutralized with a base. Thus, when using either of these thickeners the nanostructures are preferably added and dispersed prior to the addition of a base. Another embodiment of a coating solution in accordance with the present invention may have a ratio by weight of thickener to metallic nanostructures of from 0.1 to 16; a ratio by weight of a base to metallic nanostructures of from 0.01 to 0.4; and a ratio by weight of solvent to metallic nanostructures of from 90.8 to 198.8. In such embodiment the thickener may, for example, Polymer Innovations® WB40B-63 or WB40B-64 (which may also be used as thickener in any other embodiment disclosed herein); the base may, for example, be ammonium hydroxide or any other base; the solvent may, for example, be water or any other solvent such as an alcohol; and the metallic nanostructures may, for example, be silver nanowires and/or gold nanotubes or any other metallic anisotropic nanostructures disclosed herein.

In another embodiment, a coating solution in accordance with the present invention preferably includes a thickener, metallic anisotropic nanostructures and a solvent. In particular, coating solutions in accordance with this embodiment can include from 1% to 10% by weight thickener, such as, for example, ethyl cellulose (e.g. Ethocel® 100, 200, 300 from Dow®), hydroxypropyl cellulose and hydroxy propyl methyl cellulose (e.g. Sigma Aldrich Cat# 423173 and Methocel® 311) (any of which may be used as a thickener in any other embodiment disclosed herein); from 0.1 % to 1% by weight metallic anisotropic nanostructures; and from 89% to 98.9% by weight solvent such as, for example, water, propylene glycol monomethyl ether (PGME), ethyl lactate, benzyl alcohol and diacetone alcohol. When using any of the cellulose materials as thickener, the material increases in viscosity when dissolved in solution. Thus, when using cellulose thickeners it is preferable to mix in the nanostructures prior to dissolving the thickener in water. Another embodiment of a coating solution in accordance with the present invention may have a ratio by weight of thickener to metallic nanostructures of from 1 to 100; and a ratio by weight of a solvent to metallic nanostructures of from 89 to 989. In such embodiment the thickener may, for example, be ethyl cellulose (e.g. Ethocel® 100, 200, 300 from Dow®), hydroxypropyl cellulose and hydroxy propyl methyl cellulose (e.g. Sigma Aldrich Cat# 423173 and Methocel(® 311); the solvent may, for example, be water, propylene glycol monomethyl ether (PGME), ethyl lactate, benzyl alcohol and diacetone alcohol; and the metallic nanostructures may, for example, be silver nanowires and/ or gold nanotubes or any other metallic anisotropic nanostructures disclosed herein.

Substrate

As used herein, "Substrate", or "substrate of choice", refers to a material onto which the conductive features are coated. The substrate can be rigid or flexible. The substrate can be clear or opaque. Suitable rigid substrates include, for example, glass, polycarbonates, acrylics, and the like. Suitable flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films. Additional examples of suitable substrates can be found in, e.g., U.S. Pat. No. 6,975,067.

Post Treatments

It may be the case that after screen printing a feature on a substrate as described herein, the conductivity of the printed feature may not be high enough for its intended use. As such, in accordance with the present invention, a number of post-screen printing treatments may be carried out on the feature and substrate.

One post-printing treatment that was found to increase conductivity of a printed feature is washing the printed feature with alcohol after allowing the feature to dry. A second such post-printing treatment is to bake the feature on the substrate. In one embodiment, a baking post treatment can be carried out, for example, by placing the substrate and feature on a hot plate. The substrate and feature may also be placed in an oven or other heated environment for baking.

Additionally, it was found that exposing printed features to an argon or other inert gas atmosphere could increase the conductivity of the feature. For example, surface treatment of the printed features with argon or oxygen plasma can improve the conductivity of the feature. As an illustrative example, Ar or $N_2$ plasma treatment can be carried out in a March PX250 system, using the following operating parameters: 300 W, 90 sec (or 45 sec), Ar or $N_2$ gas flow: 12 sccm, pressure ~300 mTorr. Other known surface treatments, e.g., Corona discharge or UV/ozone treatment, may also be used. For example, the Enercon system can be used for a Corona treatment.

As a part of a post-treatment, printed features can further be pressure treated. In one embodiment, the substrate on which a feature is printed may be is fed through the rollers of a laminator, which apply pressure to the surface thereof. It should be understood that a single roller could also be used.

Advantageously, the application of pressure to a conductive feature fabricated in accordance with a method described herein can increase the conductivity of the feature. In particular, pressure may be applied to one or both surfaces of a conductive feature fabricated in accordance with a method described herein by use of one or more rollers (e.g., cylindrical bars), one or both of which may, but need not, have a length dimension larger than a width dimension of the conducting layer. If a single roller is used, the substrate may be placed on a rigid surface and the single roller rolled across the exposed surface thereof using known methods while pressure is applied to the roller.

In one embodiment, from 50 to 10,000 psi may be applied to the transparent conductor by one or more rollers. It is also considered that from 100 to 1000 psi, 200 to 800 psi, 300 to 500 psi or up to 3000 psi may be applied. Preferably, though not necessarily, pressure is applied to a conductive feature prior to the application of any matrix or overcoat material, discussed below.

"Nip" or "pinch" rollers may be used if two or more rollers are used to apply pressure to the conducting sheet. Nip or pinch rollers are well understood in the art and discussed in, for example, 3M Technical Bulletin "Lamination Techniques for Converters of Laminating Adhesives," March, 2004, which is hereby incorporated by reference in its entirety. Application of pressure to a printed feature may be carried out single or multiple times. If pressure is applied multiple times, for example by lamination, the lamination can be carried out in the same direction each time with respect to an axis parallel to the rolled surface of the sheet or in different directions.

Matrix or Overcoat

After deposition of conductive features onto a substrate, in certain embodiments, it may be preferable to deposit and overcoat or matrix on top of the conductive features. Overcoat or matrix refers to a solid-state material into which conductive nanostructures are dispersed or embedded. Portions of the anisotropic nanostructures may protrude from the overcoat or matrix material to enable access to the conductive network. The overcoat or matrix can act as a host for the nanostructures. The overcoat or matrix can protect the metal nanostructures from adverse environmental factors, such as corrosion and abrasion. In particular, the matrix can significantly lower the permeability of corrosive elements in the environment, such as moisture, trace amount of acids, oxygen, sulfur and the like. In addition, the overcoat or matrix offers favorable physical and mechanical properties to the conductive features. For example, it can provide adhesion to the substrate. Furthermore, unlike metal oxide films, polymeric or organic matrices embedded with anisotropic nanostructures are robust and flexible.

Moreover, the optical properties of the conductive layer can be tailored by selecting an appropriate matrix material. For example, reflection loss and unwanted glare can be effectively reduced by using a matrix of a desirable refractive index, composition and thickness.

Typically, the matrix is an optically clear material. A material is considered "optically clear" or "optically transparent", if the light transmission of the material is at least 80% in the visible region (400 nm-700 nm). Unless specified otherwise, all the layers (including the substrate and the anisotropic nanostructure layer) in a transparent conductor described herein are preferably optically clear. The optical clarity of the matrix is typically determined by a multitude of factors, including without limitation: the refractive index (RI), thickness, consistency of RI throughout the thickness, surface (including interface) reflection, and haze (a scattering loss caused by surface roughness and/or embedded particles).

In certain embodiments, the matrix is about 10 nm to 5 μm thick, about 20 nm to 1 μm thick, or about 50 nm to 200 nm thick. In other embodiments, the matrix has a refractive index of about 1.3 to 2.5, or about 1.35 to 1.8. In certain embodiments, the matrix is a polymer, which is also referred to as a polymeric matrix. Optically clear polymers are known in the art. Examples of suitable polymeric matrices include, but are not limited to: polyacrylics such as polymethacrylates (e.g., poly(methyl methacrylate)), polyacrylates and polyacrylonitriles, polyvinyl alcohols, polyesters (e.g., polyethylene terephthalate (PET), polyester naphthalate, and polycarbonates), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbornenes, synthetic rubbers (e.g., EPR, SBR, EPDM), and fluoropolymers (e.g., polyvinylidene fluoride, polytetrafluoroethylene (TFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by Du Pont).

In other embodiments, the polymeric matrix described herein comprises partially polymerized or partially cured polymer. Compared to a fully polymerized or fully cured matrix, a partially cured matrix has lesser degree of cross-linking and/or polymerization and lower molecular weight. Thus, the partially polymerized matrix can be etched under certain conditions and patterning is possible using conventional photolithography. Under a proper polymerization condition, the partially cured matrix may be further cured whereby further cross-linking and polymerization are carried out to provide a matrix of higher molecular weight than that of a partially cured matrix. The partially cured matrix can be etched, followed by a further curing step, to provide a patterned and fully-cured transparent conductive features.

Examples of suitable partially cured polymers include, but are not limited to partially cured acrylate, silicone-epoxy, siloxane, novolac, epoxy, urethane, silsesquioxane or polyimide.

In further embodiments, the matrix is an inorganic material. For example, a sol-gel matrix based on silica, mullite, alumina, SiC, MgO—$Al_2O_3$—$SiO_2$, $Al_2O_3$—$SiO_2$, MgO—$Al_2O_3$—$SiO_2$—$Li_2O$ or a mixture thereof can be used. In certain embodiments, the matrix itself is conductive. For example, the matrix can be a conductive polymer. Conductive polymers are well known in the art, including without limitation: poly(3,4-ethylenedioxythiophene) (PEDOT), polyanilines, polythiophenes, and polydiacetylenes.

Electrical and Optical Properties

Transparent conductive features produced using methods and coating solutions having electrically conductive nanostructures can have light transmission of at least 50%, at least 60%, at least 70%, at least 80%, at least 85%, at least 90%, or at least 95% (using air as reference). Haze in an index of light scattering. It refers to the percentage of the quantity of light separated from the incident light and scattered during transmission (i.e. transmission haze). Unlike light transmission, which is largely a property of the medium, haze is often a production concern and is typically caused by surface roughness and embedded particles or compositional heterogeneities in the medium. In various embodiments, the haze of the transparent conducting features is no more than 10%, no more than 8%, no more than 5%, no more than 3% or no more than 1%.

As discussed herein, a conductive feature in accordance with the present invention includes an interconnecting network of nanostructures above an electrical percolation threshold. Typically, conductive features in accordance with the present invention have a resistivity of no higher than $10^8$ ohms/square (also referred to as "$\Omega/\square$"). Preferably, the resistivity is no higher than $10^4$ $\Omega/\square$, 3,000 $\Omega/\square$, 1,000 $\Omega/\square$ or 100 $\Omega/\square$. Typically, the resistivity is in the ranges of from 10 $\Omega/\square$ to 1000 $\Omega/\square$, from 100 $\Omega/\square$ to 750 $\Omega/\square$, 50 $\Omega/\square$ to 200 $\Omega/\square$, from 100 $\Omega/\square$ to 500 $\Omega/\square$, or from 100 $\Omega/\square$ to 250 $\Omega/\square$, or 10 $\Omega/\square$ to 200 $\Omega/\square$, from 10 $\Omega/\square$ to 50 $\Omega/\square$, or from 1 $\Omega/\square$ to 10 $\Omega/\square$.

As discussed above, a conductive feature can be formed on a substrate by layering multiple coats of coating solution onto the substrate when forming a single feature. While such multiple layering generally decreases the resistivity of the feature, it can also increase the haze and decrease the transmission of the feature.

Applications

A substrate having transparent conductive features produced using the screen printing methods and apparatus disclosed herein can be used as electrodes in a wide variety of devices, including any device that currently makes use of transparent conductors such as metal oxide films. Examples of suitable devices include flat panel displays such as LCDs, plasma display panels (PDP), color filters for colored flat panel displays, touch screens, electromagnetic shielding, functional glasses (e.g., for electrochromic windows), optoelectronic devices including EL lamps and photovoltaic cells, and the like. In addition, the transparent conductive features herein can be used in flexible devices, such as flexible displays and touch screens.

(a) Liquid Crystal Display

An LCD is a flat panel display that displays an image by controlling light transmissivity by an external electric field. Typically, the LCD includes a matrix of liquid crystal cells (or "pixels"), and a driving circuit for driving the pixels. Each liquid crystal cell is provided with a pixel electrode for applying an electric field to the liquid crystal cell with respect to a common electrode. If each of the pixel electrodes is connected to a thin film transistor (TFT) together they function as a switching device, i.e., the pixel electrode drives the liquid crystal cell in accordance with a data signal applied via the TFT.

The TFT LCD panel comprises two substrates with the liquid crystal cells interposed in between. The pixel electrodes are provided on a lower substrate for each liquid crystal cell, whereas the common electrode is integrally formed on the entire surface of an upper, opposing substrate. The lower substrate, also referred to as a TFT array substrate or TFT backplane, thus comprises an array of thin film transistors connected to corresponding pixel electrodes. The upper opposing substrate, comprises the common electrode which may be coated on a color filter which combination may be referred to as the color filter substrate.

Conventionally, the pixel electrode is made of a highly transmissive ITO film in order to allow sufficient light to transmit through. As noted above, ITO films are costly to fabricate and may be susceptible to cracking if used on a flexible substrate. The anisotropic nanostructure-based transparent conductor features described herein offer an alternative approach in TFT pixel electrode fabrication.

Generally speaking, the thin film transistors described herein can be fabricated according to any known methods in the art. The nanowire-based pixel electrode can be formed by ink jetting features of the TFT back-plane with an anistropic nanostructure transparent, conductive coating.

The nanostructure-based transparent conductive features disclosed herein are compatible with all the TFT configurations currently used in the LCD technology. In general, thin film transistors fall into two broad categories: a bottom-gate type and a top-gate type. In the bottom-gate TFT, a gate electrode is disposed below an active layer, whereas in the top-gate TFT, a gate electrode is disposed above an active layer. The bottom-gate thin-film transistors typically have superior reliability in comparison with the top-gate thin-film transistor. These structural configurations are described in more detail in, for example, Modern Liquid Crystal Process Technologies '99 (Press Journal, 1998, pp. 53 to 59) and Flat Panel Display 1999 (Nikkei BP, 1998, pp. 132 to 139). Moreover, depending on the type of material that forms the active area, thin film transistors can also be based on amorphous silicon, polycrystalline silicon and organic semiconductors.

Figure 3:
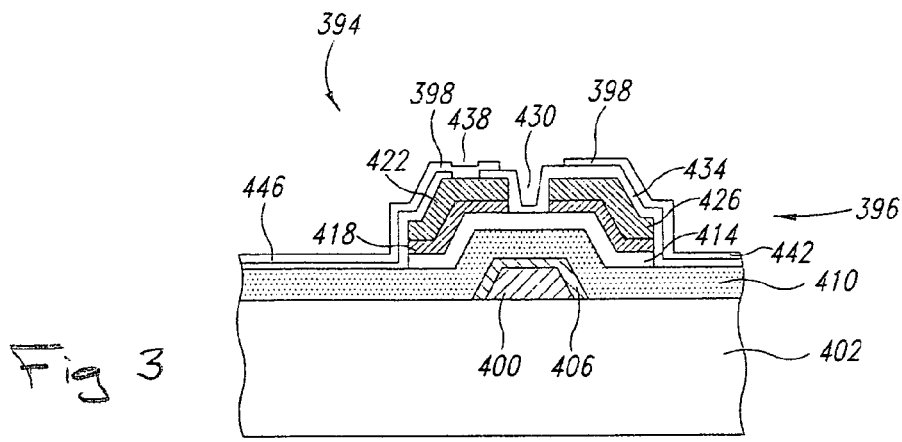
FIG. 3 is a cross-sectional view of a switching device of a TFT backplane according to one embodiment.

FIG. 3 shows the cross-sectional view of a switching device of a TFT backplane according to one embodiment. As shown, the switching device 394 comprises a bottom-gate thin film transistor 396 and a nanostructure-based pixel electrode 398. The thin film transistor includes a gate electrode 400 formed on a substrate 402. The gate electrode can be a metal layer (e.g., Mo—Al—Cd) defined by photolithography. A gate insulating layer 406 overlies the gate electrode 400. The thin film transistor 396 further includes an insulating layer 410, a first semiconductor layer 414 (e.g., amorphous silicon) and a second semiconductor layer 418 (e.g., n+doped amorphous silicon), all defined to form an island-shaped structure. A source electrode 422 and a drain electrode 426 define a channel 430, exposing a portion of the first semiconductor layer 414 (i.e., active layer). A further protective layer 434 covers the island structure, the source and drain electrodes while exposing a contact hole 438. The protective layer 434 is, for example, a silicon nitride layer. Nanostructure-based transparent conductive features 442 is coated over the thin film transistor 396 in a pattern to form the pixel electrode 398. In other portions of the TFT backplane, the same nanostructure-based transparent conductor features 442 can also be patterned to define a signal line area 446. In a further embodiment, the switching device described above can be incorporated in a liquid crystal display (LCD) device.

Figure 4:
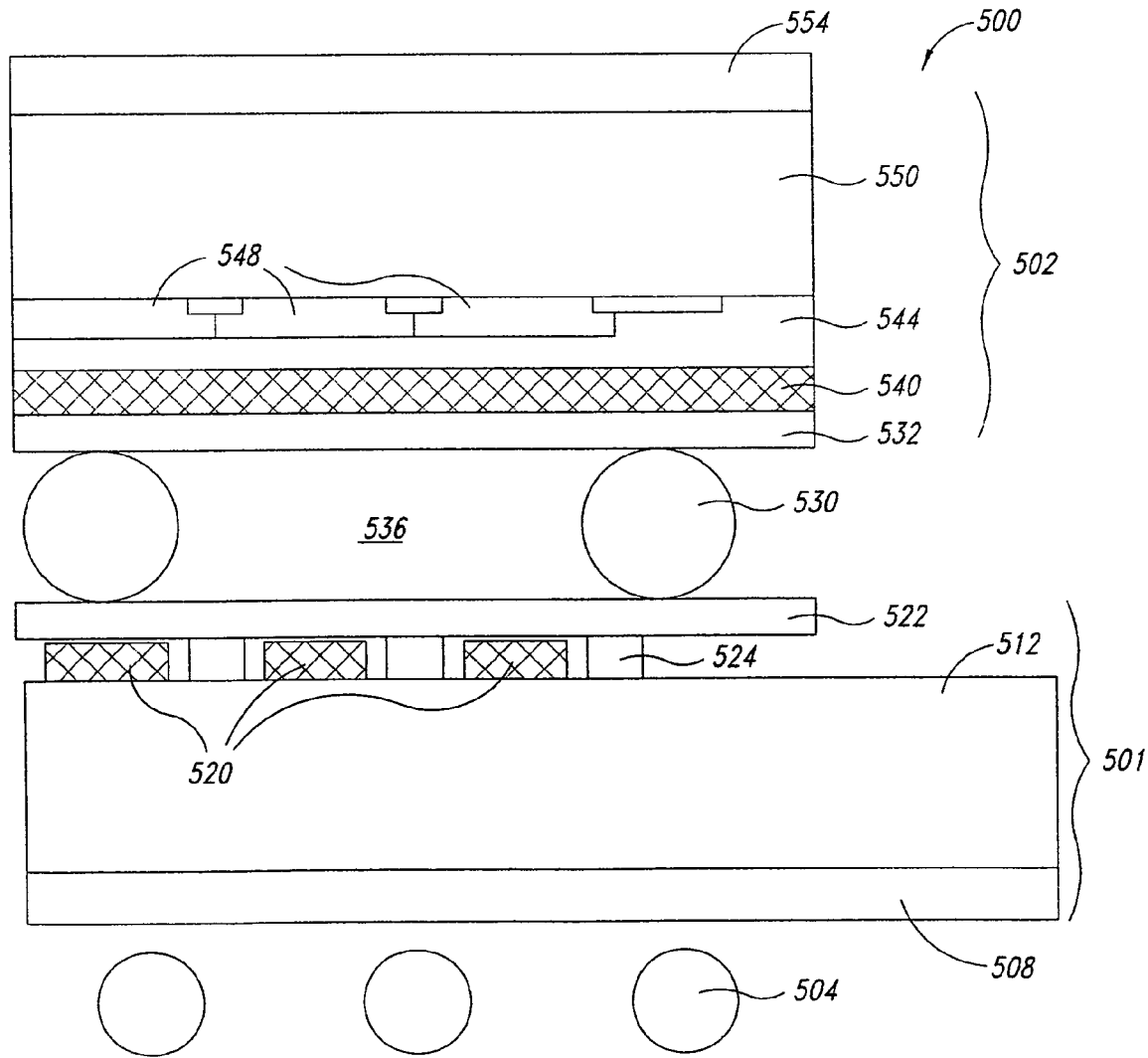
FIG. 4 shows a display device comprising transparent electrodes based on nanostructures in accordance with the present invention.

FIG. 4 shows schematically an LCD device 500 comprising a TFT backplane 501 and a color filter substrate 502. A backlight 504 projects light through a polarizer 508 and a glass substrate 512. A plurality of first transparent conductor strips 520 are positioned between the bottom glass substrate 512 and a first alignment layer 522 (e.g., a polyimide layer). Each transparent conductor strip 520 alternates with a data line 524. Spacers 530 are provided between the first alignment layer 522 and a second alignment layer 532, the alignment layers sandwiching liquid crystals 536 in between. A plurality of second transparent conductor strips 540 are positioned on the second alignment layer 532, the second transparent conductor strips 540 orienting at a right angle from the first transparent conductor strips 520. The second transparent conductor strips 540 are further coated with a passivation layer 544, a color filter of colored matrices 548, a top glass substrate 550 and a polarizer 554. Advantageously, the transparent conductor strips 520 and 540 can be formed using transparent conductive features disclosed herein screen printed onto the bottom glass substrate, and the alignment layer, respectively. Unlike the conventionally employed metal oxide strips (ITO), no costly deposition or etching processes are required.

Figure 5:
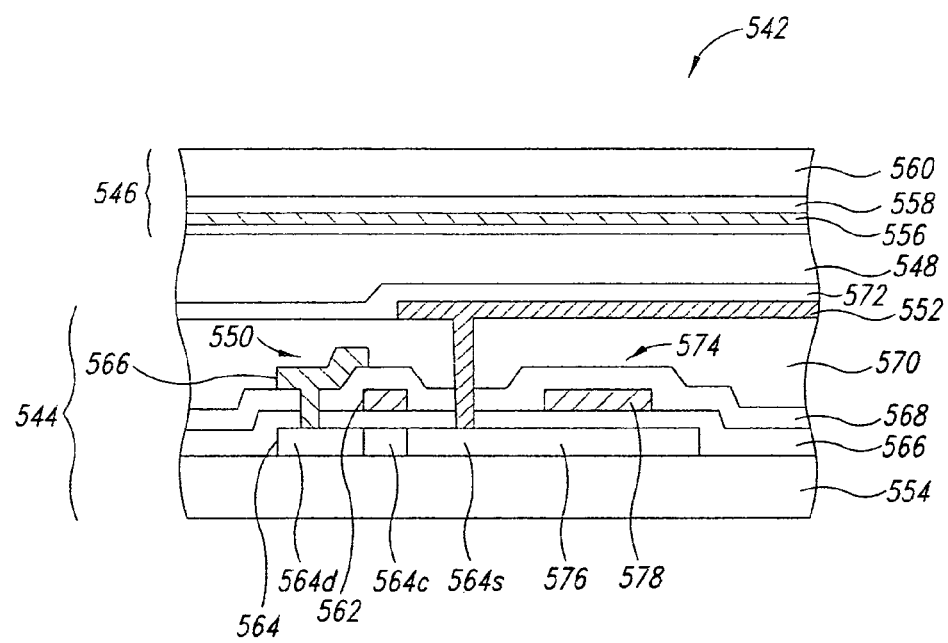
FIG. 5 shows a cross-sectional view of a LCD based on a top-gate TFT according to one embodiment.

FIG. 5 shows a cross-sectional view of a LCD based on a top-gate TFT according to another embodiment. As shown, the LCD 542 has a TFT substrate 544 and a color filter substrate 546 with a liquid crystal layer 548 interposed between them. As noted above, in the TFT substrate 544, thin film transistors 550 and pixel electrodes 552 are arranged in a matrix configuration on a bottom transparent substrate 554. A common electrode 556, to which a common voltage can be supplied and a color filter 558 are disposed on a top transparent substrate 560. A voltage applied between the pixel electrode 552 and the common electrode 556, which are facing each other with the liquid crystal 548 between them, drives the liquid crystal cells (pixels).

The thin film transistor 550 disposed for each of the pixels on the bottom transparent substrate 554 is a top-gate type TFT, whose gate electrode 562 is located above an active layer 564. The active layer 564 of the TFT is patterned on the bottom substrate 554 according to known methods in the art. A gate insulating layer 566 overlies and covers the active layer 564. The part of the active layer 564 facing the gate electrode 562 is a channel region 564c. A drain region 564d and a source region 564s with an impurity doped are positioned at respective sides of the channel region 564c. The drain region 564d of the active layer 564 is connected to a data line, which functions also as a drain electrode 566, through a contact hole formed in an interlayer insulating layer 568 covering the gate electrode 562. Also, an insulating layer 570 is disposed to cover the data line and the drain electrode 566. Nanostructure-based transparent conductive features forming the pixel electrode 552 are positioned on the insulating layer 570. The pixel electrode 552 is connected to the source region 564s of the active layer 564 through a contact hole. A first alignment layer 572 may be positioned on the pixel electrode. FIG. 13 further shows a storage capacitance element 574, which can be disposed for each pixel. The storage capacitance element maintains the electric charge corresponding to the display contents, which should be applied to the liquid crystal capacitance, when the TFT is not selected. Therefore, the voltage change of the pixel electrode 552 can be maintained, enabling the display contents to be kept unchanged during one sequence. As shown, the source region 564s of the active layer 564 functions also as a first electrode 576 of the storage capacitance element 574. A second electrode 578 of the storage capacitance element 574 can be formed simultaneously with and in the same layer as the gate electrode 562. The gate insulating layer 566 also works as a dielectric between the first electrode 576 and the second electrode 578. The gate electrode 566 (i.e., gate line) and the second electrode 578 (i.e., a storage capacitance line) are arranged in parallel. They are oriented at a right angle from the pixel electrode 552 to define the matrix of pixels.

It should be understood that for both of the bottom-gate and top-gate TFT configurations, the active layer can be any acceptable semiconductor material. Typically, amorphous silicon is widely used due to the ease and economy of the deposition and patterning steps. Polycrystalline silicon can also be used. Because polycrystalline silicon has better current-driving capability than amorphous silicon, it provides superior performance when used in a switching device. Low temperature deposition of polycrystalline silicon is possible and has been reported as an alternative approach to manufacturing polycrystalline silicon-based TFT, see, e.g., U.S. Pat. No. 7,052,940. In addition, organic semiconductor material can also be used. In certain embodiments, an organic π conjugate compound can be used as the organic semiconductor material that forms the active layer of an organic TFT. The π conjugate compounds are known in the art, which include without limitation: polypyrroles, polythiophenes (may be optionally doped with $C_{60}$), polypyrenes, polyacetylene and polybenzothiophenes, and the like. More examples of the organic semiconductor materials suitable for the organic TFTs are described in, for example, U.S. Pat. No. 7,018,872.

As discussed herein, the TFT backplane is positioned in an LCD opposite to a color filter substrate (see, e.g., FIGS. 24 and 25). The color filter substrate typically comprises a transparent substrate, a black matrix (or a light-shielding layer) and an array of colored pixels. Typically, the colored pixels are arranged on the transparent substrate in a pattern. The black matrix forms a grid around each colored pixel. In certain embodiments, each colored pixel is associated with a color. In other embodiments, each colored pixel can be further divided into smaller colorant areas (referred to as subpixels), each subpixel being associated with a color. Typically, primary colors such as red (R), green (G) and blue (B) are used. For example, repeating arrays of RGB triads are capable of producing color images of a wide variety of colors. The colored pixels or subpixels are not limited to primary colors, other colors such as white, yellow or cyan can also be used.

Depending on the mode of an LCD, the relative positions of the common electrode and the unit color filters can be different in a TN (twisted nematic) mode from that in an IPS (In-plane-switching) mode.

(b) Plasma Display Panel

A plasma display panel emits visible light by exciting fluorescent materials (e.g., phosphors) with ultraviolet light generated by a plasma discharge. The plasma display panel employs two insulating substrates (e.g., glass plates), each insulating substrate having electrodes and barrier ribs formed thereon to define individual cells (pixels). These cells are filled with one or more inert gases (e.g., Xe, Ne or Kr), which can be ionized under an electrical field to produce the plasma. More specifically, address electrodes are formed behind the cells, along a rear glass plate. Transparent display electrodes, along with bus electrodes, are mounted in front of the cells, on a front glass plate. The address electrodes and the transparent display electrodes are orthogonal from one another and cross paths at the cells. In operation, a control circuitry charges the electrodes, creating a voltage difference between the front and back plates and causing the inert gases to ionize and form the plasma.

Metal oxide transparent conductors (e.g., ITO) are conventionally used as the transparent display electrodes on the upper glass plate to allow the plasma-generated visible light through. Nanostructure-based transparent traces are suitable electrode materials for the display electrodes in a PDP. They can be screen printed as disclosed herein at the required features sizes (e.g., 100-300 μm).

Figure 6:
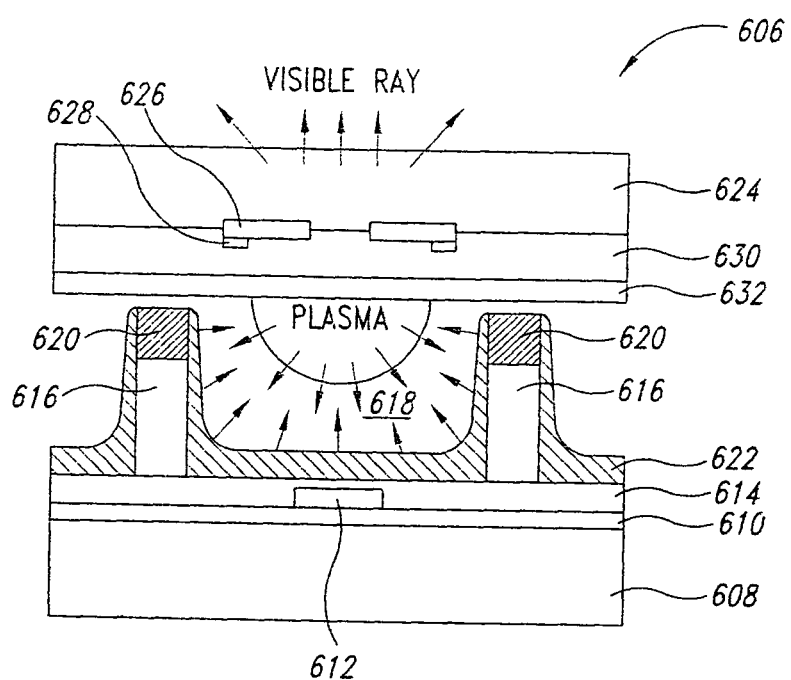
FIG. 6 shows a cross-sectional view of a PDP according to one embodiment.

FIG. 6 shows a cross-sectional view of a PDP according to one embodiment. The PDP 606 includes: a lower transparent substrate 608; a lower insulation layer 610 formed on the lower transparent substrate 608; an address electrode 612 formed on the lower insulation layer 608; a lower dielectric layer 614 formed on the address electrode 612 and the lower insulation layer 610; isolation walls 616 defining a discharging cell 618; black matrix layers 620 positioned on the isolation walls 616; a fluorescent layer 622 formed on the sides of the black matrix layer 620 and the isolation wall 616 and on the lower insulation layer 608; an upper transparent substrate 624; a display electrode 626 formed on the upper transparent substrate 624 and positioned at a right angle in relation to the address electrode 612; a bus electrode 628 formed on a portion of the display electrode 626; an upper dielectric layer 630 formed on the bus electrode 628, the display electrode 626 and the upper transparent substrate 624; and a protection layer (e.g., MgO) 632 formed on the upper dielectric layer 630. The display electrodes can be formed by conductive nanostructure traces deposited according to methods described herein.

It should be understood that the nanostructure-based transparent conductive features are suitable for any other configurations of PDP in which transparent electrodes are positioned on a display panel such that light can transmit with acceptable efficiency to create an image on the display panel.

(c) Photovoltaic Cells

Solar radiation provides a usable energy in the photon range of approximately 0.4 eV to 4 eV. Optoelectronic devices such as photovoltaic (PV) cells can harvest and convert certain photon energies in this range to electrical power. Photovoltaic cells are essentially semiconductor junctions under illumination. Light is absorbed by the semiconductor junction (or diode) and electron-hole pairs are generated on both sides of the junction, i.e., in the n-type emitter and in the p-type base. These charge carriers—electrons from the base and holes from the emitter—then diffuse to the junction and are swept away by the electric field, thus producing electric current across the device. The semiconductor junction can be formed in a homojunction cell by doping a single material (e.g., crystalline silicon) to form p-type and n-type sides. Either PN structure or P-i-N structure can be used.

A heterojunction can be formed by contacting two different semiconductors. Typically, the two semiconductors have different band gaps. The one with the higher bandgap is selected for its transparency and positioned as a top layer or window layer. The one with the lower bandgap forms a bottom layer, which functions as a light-absorbing material. The window layer allows almost all incident light to reach the bottom layer, which readily absorbs light.

Multi-junction cells have been developed to capture a larger portion of the solar spectrum. In this configuration, individual heterojunction cells are stacked in such a way that sunlight falls first on the material having the largest bandgap. Photons not absorbed in the first cell are transmitted to the second cell, which then absorbs the higher-energy portion of the remaining solar radiation while remaining transparent to the lower-energy photons. These selective absorption processes continue through to the final cell, which has the smallest bandgap.

In excitonic PV cells, instead of a p-doped and n-doped region, the materials of different band gaps are used to split and exciton via charge transfer from one semiconductor to the other. After charge separation, the charges are swept away due to built in potential which is created due to the difference in work function between the contact electrodes for charge collection. Organic photovoltaic cells, for example, work this way where one semiconductor can be a polythiophene and the other C60. Polythiophene absorbs light and an exciton is created. The electron jumps from polythiophene to C60 (lower energy state for the electron). The holes move along the polytiophene backbone until they are collected as do the electrons by hopping between buckyballs.

Ohmic metal-semiconductor contacts are provided to both the n-type and p-type sides of the solar cell. In multi-junction cells, they are also interposed between two adjacent cells. Electrons that are created on the n-type side, or have been "collected" by the junction and swept onto the n-type side, may travel through the wire, power the load, and continue through the wire until they reach the p-type semiconductor-metal contact. Because transparent conductors (e.g., ITO) allow light to pass through a window layer to the active light absorbing material beneath, as well as serve as ohmic contacts to transport photo-generated charge carriers away from that light absorbing material, they are desired as contact materials for solar cells.

Figure 7:
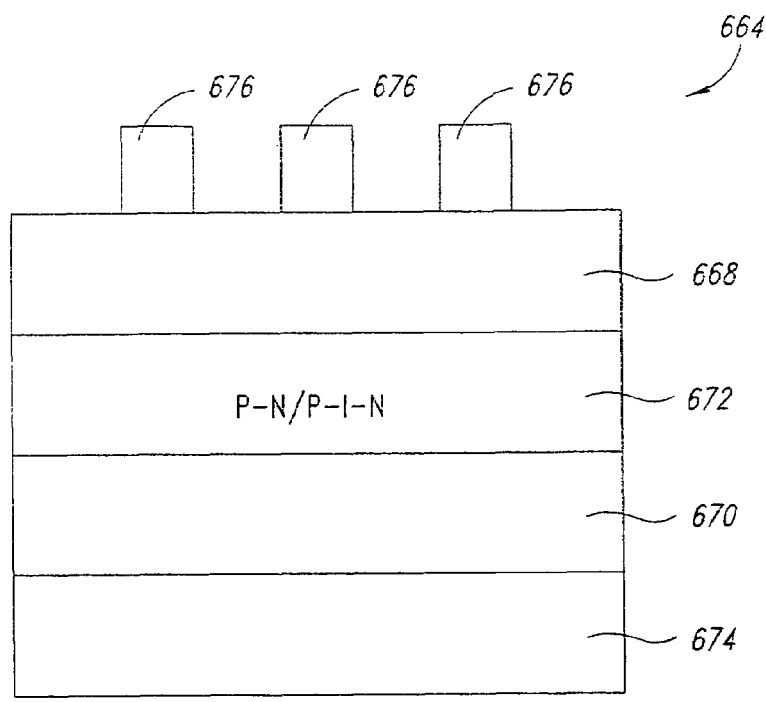
FIG. 7 shows a homojunction solar cell structure according to one embodiment.

FIG. 7 shows a homojunction solar cell 664. The solar cell 644 includes a top contact 668, a bottom contact 670, and a semiconductor diode 672 interposed therebetween. The semiconductor diode can be, for example, a PN structure with the p-doped silicon on the top and N-doped silicon on the bottom. The silicon is typically crystalline silicon. As a more economical alternative, polycrystalline silicon can be used according to known methods in the art. The semiconductor diode can also be formed of amorphous silicon, in which case, a P-i-N structure is preferred.

The top contact is typically optically clear and comprises a light incidence surface, i.e., the surface that light initially enters in the solar cell. Optionally, a substrate 674 can be present underneath the bottom contact 670. Also optionally, bus bars 676 can be formed overlying the top contact. The bus bars 676 can be formed by screen printing nanostructure-based transparent conductive lines as described herein.

Figure 8:
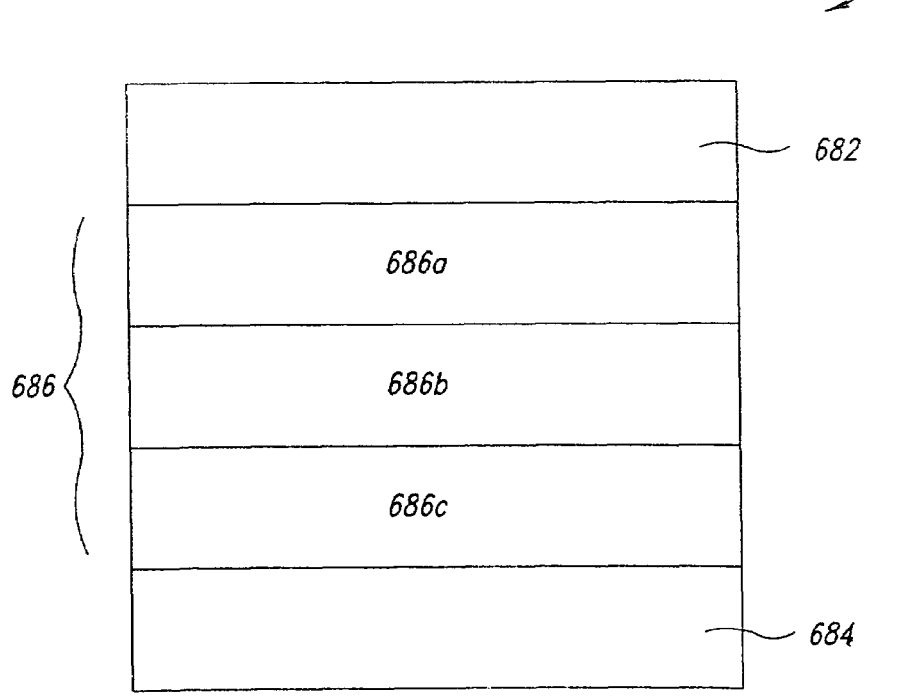
FIG. 8 shows a heterojunction solar cell structure according to another embodiment.

FIG. 8 shows a heterojunction solar cell according to another embodiment. As shown, the heterojunction solar cell 680 includes a top contact 682, a bottom contact 684, and a semiconductor heterojunction layer 686 interposed therebetween.

In certain embodiments, the semiconductor heterojunction layer 686 comprises a three-layer structure (e.g., N-i-P). Thus, it may comprise a doped top semiconductor layer 686a, an undoped middle semiconductor layer 686b and a doped bottom semiconductor layer 686c. In certain embodiment, the first semiconductor layer 686a has a higher bandgap than the third semiconductor layer 686c.

The first, second and third semiconductor layers can be deposited as thin film layers. Suitable semiconductor materials include, but are not limited to, organic semiconductor materials (as discussed herein), cadmium telluride (CdTe), copper indium gallium selenide (CIGS), copper indium selenide (CIS), and the like. For example, in a typical CdTe cell, the top layer is p-type cadmium sulfide (CdS), the middle layer is intrinsic CdTe, and the bottom layer is n-type zinc telluride (ZnTe). It is also possible for the semiconductor heterojunction layer 686 to include only the top semiconductor layer 686a and the bottom semiconductor layer 686c in a NP structure.

Figure 9:
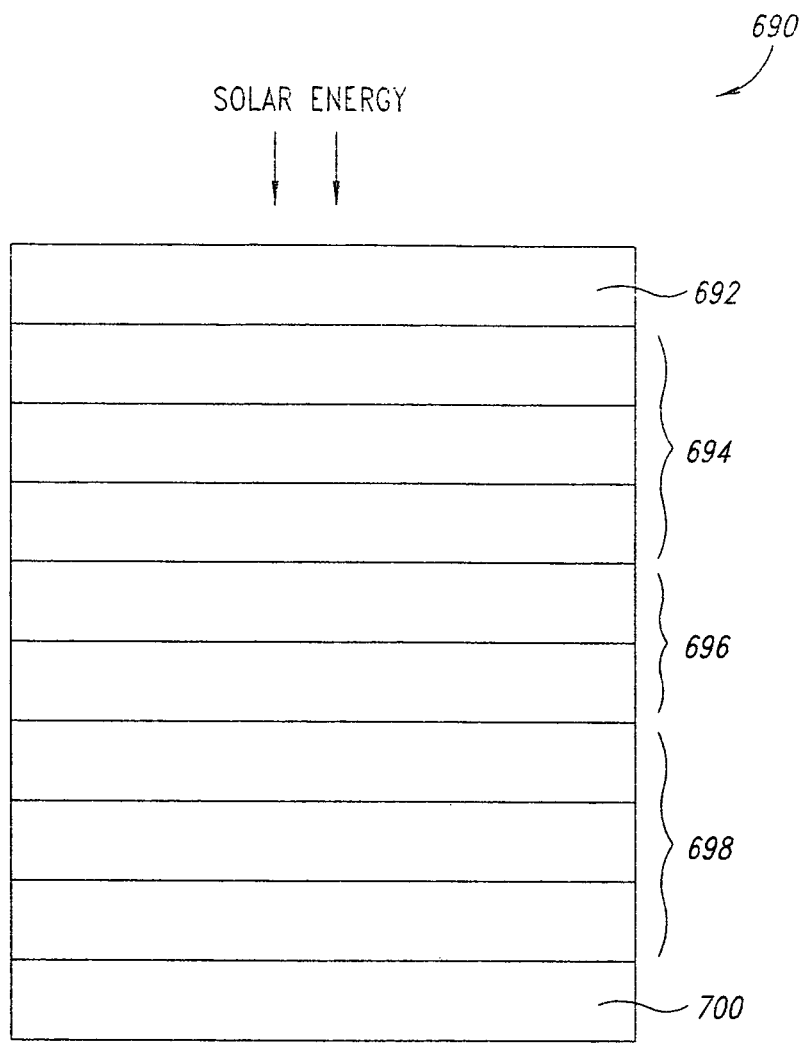
FIG. 9 shows a multi-junction solar cell structure according to another embodiment.

Heterojunction cells based on thin film semiconductor layers save material cost, compared to that of silicon-based solar cells. However, due to inferior performance of thin film semiconductor layers, such devices are less efficient than the poly-silicon-based cells in energy conversion. Thus, in one embodiment, a multifunction cell is described in connection with FIG. 9. As shown, the multifunction cell 690 includes, sequentially from top to bottom: a top contact 692, a first cell 694, a tunnel layer 696, a second cell 698 and a bottom contact 700, wherein the top contact 692 and the bottom contact 700 are made of conductive nanostructure -based transparent films as disclosed herein. For purpose of simplicity, the multifunction cell 690 is shown to include only two cells. It should be understood, however, that additional cells can be fabricated in similar fashion.

Both the first cell 692 and the second cell 698 have similar 3-layer structures as the single junction solar cell 680 shown in FIG. 29B. The first cell is closer to an impinging light and should therefore be selected to have a larger bandgap than that of the second cell. In doing so, the first cell is transparent to the lower energy photons, which can be absorbed by the second cell 698.

The first and second cells are separated by a tunnel layer 696 to allow the flow of electrons between the cells. The tunnel layer 696 can be a PN diode comprising oppositely doped semiconductor layers.

The top contacts 692 and the bottom contacts 700 are nanowire-based transparent conductor films. They can be prepared by the methods described herein. The solar cell 690 can include additional layers such as substrates, bus bars, anti-reflective films and the like, as will be recognized by one skilled in the art. Further, it should be understood that the nanostructure-based transparent films disclosed herein are suitable as one or more contacts in any solar cell configurations.

EXAMPLES

Example 1

Synthesis of Silver Nanowires

Silver nanowires were synthesized by a reduction of silver nitrate dissolved in ethylene glycol in the presence of poly (vinyl pyrrolidone) (PVP). The method was described in, e.g. Y. Sun, B. Gates, B. Mayers, & Y. Xia, "Crystalline silver nanowires by soft solution processing", *Nanolett*, (2002), 2(2) 165-168. Uniform silver nanowires can be selectively isolated by centrifugation or other known methods.

Alternatively, uniform silver nanowires can be synthesized directly by the addition of a suitable ionic additive (e.g., tetrabutylammonium chloride) to the above reaction mixture. The silver nanowires thus produced can be used directly without a separate step of size-selection. This synthesis is described in more detail in U.S. Provisional Application No. 60/815,627, in the name of Cambrios Technologies Corporation, the assignee of the present application, which application is incorporated herein in it entirety.

Example 2

Screen Printing Conductive Coating Solution; Electrical Properties

Silver nanowires prepared as described herein and purified via sedimentation and solvent exchange and were then allowed to sediment in water for 1 week. The nanowires had lengths of approximately 11.5 um to 15.5 um and ranged in diameter from approximately 35 nm to 45 nm. The water was decanted and the sediment nanowires were allowed to fully dry. PGME was then added to the nanowires and mixed. The nanowires were then allowed to sediment for an additional 1 week and the PGME was decanted. Portions of the resultant nanowires were then separately added to 2 different thickeners, Dupont® 3671 and Borchi® Gel PW 25, and mixed, each solution having approximately 99% by weight thickener and approximately 1% by weight nanowires. Also an additional 4 coating solutions were prepared using from approximately 1% to 10% by weight Ethocel® 300 and, each separately, from approximately 89% to 98% PGME, Ethyl Lactate, Benzyl Alcohol and Diacetone Alcohol, each mixed with approximately 1% by weight nanowires.

Each of the coating solutions was screen printed onto a transparent PET substrate using an AMI-Presco MSP-485 screen printer. The gap between the substrate and the screen was set at 0.010 inches to 0.035 inches. A durometer 90 squeegee was used with a screen of 250 mesh stainless steel. The printed pattern were bus bars that were approximately 0.6 cm wide by 5.6 cm. long. The emulsion thickness was 0.0005 inches. The bus bar features were then allowed to dry. The resistance of each bus bar was then measured using a two point ohmmeter from Keithly® instruments and each feature was rinsed with alcohol for 1 minute and the resistance was measured again. Finally, each bus bar was heated at 120 C for up to 5 minutes and again rinsed with alcohol and the resistance was measured. The resulting resistance measurements are shown in Table 1 below.

| Thickener | Feature Resistance (Ohms) |
|---|---|
| Ethocel ® 300 | 20 to 4000 |
| Dupont ® 3571 | 100,000 |
| Borchi ® Gel PW 25 | 150 to 80000 |

The range in resistance measurements for the Ethocel® 300 and Borchi® Gel PW 25 resulted from measurements being taken at different points along the ends of the bus bars. Resistance measurements dropped by about 10% after the first alcohol rinse and by another approximately 10% after the bake and second alcohol rinse. As shown, conductive features on a substrate can be produced by screen printing coating solutions containing conductive, anisotropic nanostructures.

Example 3

Screen Printing Conductive Coating Solution; Electrical and Optical Properties

Silver nanowires prepared as described herein and purified via sedimentation and solvent exchange were allowed to sediment in water for 1 week. The nanowires had lengths of approximately 11.5 um to 15.5 um ranged in diameter from approximately 35 nm to 45 nm. The water was decanted. Portions of the resultant nanowires were then separately added to different weight percents (as shown below in Table 2 and Table 3) of Polymer Innovations® WB40B-63 (Table 2) and, separately, WB40B-64 (Table 3) to produce solutions having 0.7% by weight silver nanowires, the below indicated weight percent of thickener, with the remaining solution water. Each mixture was screen printed to produce approximately 3 by 4 inch, rectangular conductive features on transparent PET. The resistivity, transparency and haze of each feature were then measured. The resistivity was measure both by using a Delcom resistance measurement device and by using a four point contact resistance measurement probe. The results of the resistivity measurement for each mixture are shown below in Table 2 and Table 3.

TABLE 2

| % Thickener (WB40B-63) | Delcom Resist. (ohm/sq) | 4-Point Resist. (ohm/sq) | % Transmission | % Haze |
|---|---|---|---|---|
| 0 | 26.3 | 21.5 | 88.6 | 2.66 |
| 0.5 | 193 | 169 | 88.4 | 2.97 |
| 1.25 | >100000 | >100000 | 88.2 | 3.58 |
| 2.5 | >100000 | >100000 | 88.7 | 3.4 |
| 5 | >100000 | >100000 | 88.7 | 4.34 |
| 7.5 | >100000 | >100000 | 88.8 | 12.4 |

TABLE 3

| % Thickener (WB40B-64) | Delcom Resist. (ohm/sq) | 4-Point Resist. (ohm/sq) | % Transmission | % Haze |
|---|---|---|---|---|
| 0 | 26.13 | 21.8 | 88.5 | 2.66 |
| 0.1 | 27.9 | 25.9 | 88.8 | 2.86 |
| 0.25 | 95 | 75 | 88.7 | 3.08 |
| 0.5 | 1960 | 1500 | 88.5 | 3.53 |
| 0.75 | >100000 | >100000 | 88.5 | 3.63 |
| 1 | >100000 | >100000 | 88.5 | 3.76 |
| 1.5 | >100000 | >100000 | 88.1 | 3.67 |

As shown, for either thickener WB40B-63 (Table 2) or thickener WB40B-64 (Table 3) the resistance of the features becomes relatively quite high after about 0.5% thickener is used.

Figure 10:
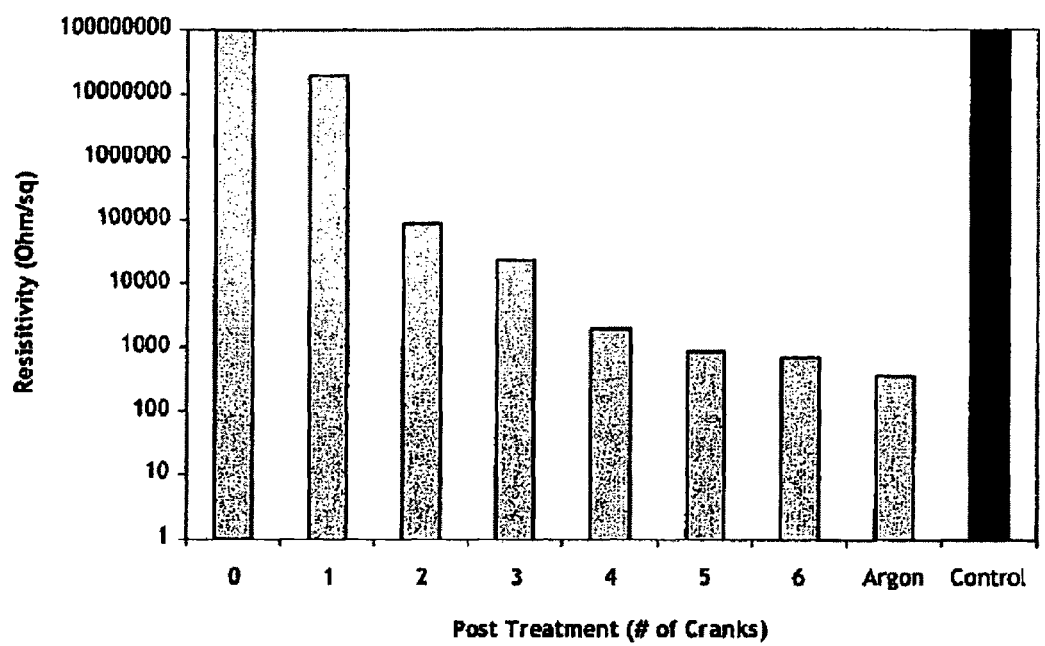
FIG. 10 is a graph illustrating results of a pressure post-treatment applied to conductive features in accordance with the present invention.

The feature printed using 1.25% WB40B-63 thickener were additionally put through a Pepetools Model PEPE 189.00 laminator six times. After each lamination, the resistance was measured. Additionally, after 6 passes through the laminator, the feature was exposed to an argon atmosphere and the resistance was once again measured. The results of the lamination and argon treatments are shown in FIG. 10. The resistivity is given on the vertical axis and the number of passes through the laminator is shown on the horizontal axis. The bar labeled "Argon" is the resistance measurement after the argon treatment. The final bar is the control bar, which was neither laminated nor treated with argon. As shown, the lamination reduced the resistance of the features from at least 10,000 kΩ to around 1 kΩ, after being laminated 6 times. Additionally, the argon treatment further reduced the resistance to below 1 kΩ.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A coating composition for screen printing including:
    a thickener;
    a base; and
    0.1-1% metallic anisotropic nanostructures by weight of coating composition,
    wherein the base is in an amount sufficient to neutralize the thickener to provide the coating solution having a viscosity greater than 200 cP.

2. The coating composition of claim 1 wherein a ratio of thickener to anisotropic nanostructures is from 99 to 999.

3. The coating composition of claim 2 wherein the thickener is polyurathane in a solution of water and propylene glycol (4:6).

4. A coating composition for screen printing comprising:
    a cellulose thickener;
    a base;
    0.1-1% metallic anisotropic nanostructures; and
    a solvent, wherein the base is in an amount sufficient to neutralize the thickener to provide the coating solution having a viscosity greater than 200 cP.

5. The coating composition of claim 4 wherein;
    a ratio of thickener to anisotropic nanostructures is from 1 to 100; and
    a ratio of solvent to anisotropic nanostructures is from 89 to 989.

6. The coating composition of claim 5 wherein the thickener is one of ethyl cellulose, hydropropyl cellulose and hydroxyl propyl cellulose and the solvent is one of water, PGME, ethyl lactate, benzyl alcohol and diacetone alcohol.

7. The coating composition of claim 4 wherein:
    a ratio of thickener to anisotropic nanostructures is from 0.1 to 16;
    a ratio of solvent to anisotropic nanostructures is from 90.8 to 198.8; and
    a ratio of base to anisotropic nanostructures is from 0.01 to 0.4.

8. The coating composition of claim 7 wherein the thickener includes an acrylic polymer.

9. The coating composition of claim 1 wherein the metallic anisotropic nanostructures are metallic nanowires or metallic nanotubes.

10. The coating composition of claim 4 wherein the metallic anisotropic nanostructures are silver nanowires or gold nanotubes.

11. The coating composition of claim 1 having a viscosity of greater than 900 cP.

12. The coating composition of claim 4 having a viscosity of greater than 900 cP.

* * * * *